(12) United States Patent
Noh et al.

(10) Patent No.: US 7,005,923 B2
(45) Date of Patent: Feb. 28, 2006

(54) ADAPTIVE BIAS CIRCUIT FOR A POWER AMPLIFIER

(75) Inventors: Youn Sub Noh, Daejeon (KR); Chul Soon Park, Daejeon (KR)

(73) Assignee: Information and Communications University Educational Foundation, Seoul (KR)

( * ) Notice: Subject to any disclaimer, the term of this patent is extended or adjusted under 35 U.S.C. 154(b) by 57 days.

(21) Appl. No.: 10/762,185

(22) Filed: Jan. 22, 2004

(65) Prior Publication Data

US 2004/0227577 A1 Nov. 18, 2004

(30) Foreign Application Priority Data

May 15, 2003 (KR) .................. 10-2003-0030973

(51) Int. Cl.
*H03G 3/10* (2006.01)
(52) U.S. Cl. .................. 330/285; 136/296
(58) Field of Classification Search .......... 330/136, 330/285, 296
See application file for complete search history.

(56) References Cited

U.S. PATENT DOCUMENTS

| | | | | |
|---|---|---|---|---|
| 4,074,334 A | * | 2/1978 | D'Arrigo et al. | 361/79 |
| 5,150,076 A | * | 9/1992 | Asazawa | 330/296 |
| 6,417,735 B1 | * | 7/2002 | Luo | 330/296 |
| 6,486,739 B1 | * | 11/2002 | Luo | 330/288 |
| 6,515,546 B1 | * | 2/2003 | Liwinski | 330/296 |
| 6,774,724 B1 | * | 8/2004 | Krvavac | 330/296 |
| 6,803,822 B1 | * | 10/2004 | Kim et al. | 330/296 |
| 6,842,075 B1 | * | 1/2005 | Johnson et al. | 330/296 |
| 6,873,211 B1 | * | 3/2005 | Thompson et al. | 330/285 |

* cited by examiner

*Primary Examiner*—Peguy Jeanpierre
*Assistant Examiner*—Khai M. Nguyen
(74) *Attorney, Agent, or Firm*—Bacon & Thomas, PLLC

(57) ABSTRACT

An adaptive bias circuit is provided for an amplifier module including a RF power amplifier for amplifying an input signal to generate an output signal, wherein the bias circuit receives the input signal to adjust a driving current to control a quiescent current of the RF power amplifier. The adaptive bias circuit includes means for providing the driving current to the bias circuit and means for drawing a bypass current from the providing means to reduce the driving current in response to the input signal, wherein the quiescent current is reduced when the driving current is reduced and the bypass current increases when the input signal is reduced.

5 Claims, 1 Drawing Sheet

ADAPTIVE BIAS CIRCUIT FOR A POWER AMPLIFIER

FIELD OF THE INVENTION

The present invention relates to a bias circuit for an amplifier module; and, more particularly, to an adaptive bias circuit capable of improving a power added efficiency of a power amplifier when an output power is low as well as maintaining a high linearity of the power amplifier when the output power is high.

BACKGROUND OF THE INVENTION

In a wireless mobile communications system, a power amplifier is a key component that determines a lifetime of a battery in a mobile terminal, e.g., a conventional CDMA mobile handset. Thus, the power amplifier is required to be of a high efficiency characteristic in order to increase the lifetime of the battery. Since the power added efficiency of the conventional power amplifier is highest when an output power thereof is at its highest level, it lowers as the output power backs off at the highest level, e.g., 30 dBm. However, the conventional power amplifier usually operates at a relatively low output power ranging from, e.g., −15 to 15 dBm. Therefore, there have been proposed various schemes capable of improving the power added efficiency of the power amplifier at such low output power range, by way of increasing a quiescent current when an output power is high and decreasing the quiescent current when the output power is low.

Such methods include a technique for controlling $V_{CC}$ (DC supply) or $V_B$ (base bias voltage) of a bias circuit, and a dual bias control technique for controlling both $V_{CC}$ and $V_B$. All of these techniques adopt a DC-to-DC converter, which requires a DSP (digital signal processor), or an RF (radio frequency) coupler together with an envelope detector for the control thereof, specifically the RF coupler together with the envelope detector being adopted in case the control is implemented in an RF range.

The technique for controlling $V_{CC}$ mentioned above is directed to reduce DC power consumption when the power amplifier is in the low output power mode. To be specific, $V_{cc}$ is reduced in the low output power mode but increased in the high output power mode by using the DC-to-DC converter to thereby improve the efficiency of the power amplifier.

The technique for controlling $V_B$ mentioned above accomplishes the power added efficiency improvement by way of adopting the DC-to-DC converter to control $V_B$. To be more specific, in the low output power mode, the DC-to-DC converter reduces the bias current and thus, decreases the DC power consumption, while, in the high output power mode, the DC-to-DC converter increases the bias current.

The dual bias control technique increases the power added efficiency of the power amplifier by simultaneously controlling both $V_{CC}$ and $V_B$ in a manner described above.

All of the above-mentioned conventional techniques adopt the DC-to-DC converter to control the DC power consumption depending on the output power mode of the power amplifier. These conventional techniques, however, have a drawback in that it is very difficult to install such components as the RF coupler/envelope detector and the DC-to-DC converter within a highly miniaturized module of power amplifier having a size of, e.g., 6×6 mm². Thus, it may be desired to develop a method for increasing the power added efficiency of the power amplifier when the output power is low as well as maintaining a high linearity of the power amplifier when the output power is high without an additional component such as the DC-to-DC converter.

SUMMARY OF THE INVENTION

It is, therefore, an object of the present invention to provide a cost-effective and miniaturized adaptive bias circuit capable of effectively controlling DC power consumption as the output power varies to thereby greatly improve a power added efficiency when the output power is low as well as maintaining a high linearity of the power amplifier when the output power is high.

In accordance with the present invention, there is provided a bias circuit for an amplifier module including an amplifier for amplifying an input signal to generate an output signal, the bias circuit receiving the input signal to control a quiescent current of the amplifier.

BRIEF DESCRIPTION OF THE DRAWINGS

The above and other objects and features of the present invention will become apparent from the following description of the preferred embodiment given in conjunction with the accompanying drawings, in which.

DETAILED DESCRIPTION OF THE PREFERRED EMBODIMENTS

Figure 1:
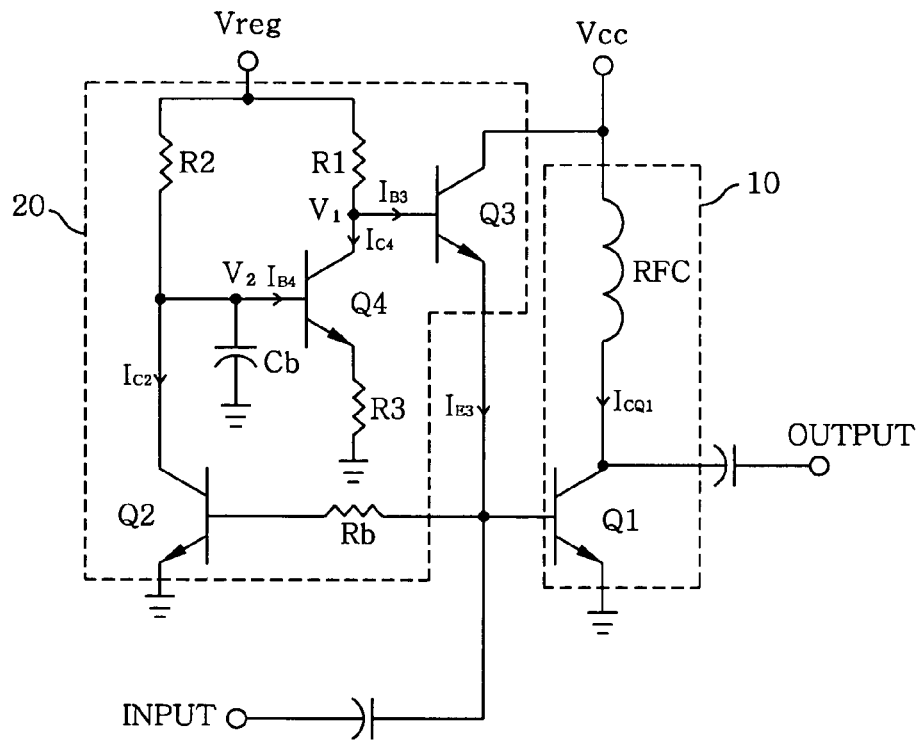
FIG. 1 illustrates a power amplifier module including an adaptive bias circuit in accordance with a preferred embodiment of the present invention.

Referring to FIG. 1, there is provided a power amplifier module including an adaptive bias circuit in accordance with a preferred embodiment of the present invention. The power amplifier module includes an RF (radio frequency) power amplifier 10 having a first transistor Q1 and an RF choke inductor RFC; and an adaptive bias circuit 20 having a second transistor Q2, a third transistor Q3, a fourth transistor Q4, a bypass capacitor Cb, a base resistor Rb, a first bias resistor R1, a second bias resistor R2 and an emitter resistor R3. An input terminal of the power amplifier module is connected to both the RF power amplifier 10 and the bias circuit 20. A DC source voltage supply Vcc is connected to both the RF power amplifier 10 and the bias circuit 20 and a regulated voltage supply Vreg is connected to the bias circuit 20.

Functioning as a class-AB power amplifier, the RF power amplifier 10 receives an input signal from the input terminal, and amplifies the input signal to generate an output signal. This amplification is performed by the first transistor Q1, a collector thereof connected to an output terminal and the RF choke RFC, a base thereof connected to the input terminal and an emitter thereof connected to the ground. Preferably, the first transistor Q1 is of a multi-cell structure. An operating point of the RF power amplifier 10 is given by a quiescent current $I_{CQ1}$, i.e., a collector current of the first transistor Q1 without a signal component. The RF choke RFC, connected between the DC source voltage supply Vcc and the collector of the first transistor Q1, prevents an RF signal from going into the DC source voltage supply Vcc.

The adaptive bias circuit 20 also receives the input signal from the input terminal and controls a bias of the first transistor Q1 in response to the input signal, increasing or decreasing the quiescent current of the first transistor Q1 when an output power increases or decreases. In the following, the adaptive bias circuit 20 will be described in detail.

The second transistor Q2, a base thereof connected to the base resistor Rb, receives the input signal via the base resistor Rb and amplifies the received input signal. An input power of the second transistor Q2 can be adjusted by varying the base resistor Rb. A collector of the second transistor Q2 is connected to the second bias resistor R2 and the bypass capacitor Cb and an emitter of the second transistor Q2 is connected to the ground. The bypass capacitor Cb directs an RF signal to the ground, thereby preventing the RF signal from flowing into a base of the fourth transistor Q4. The second bias resistor R2, connected between the collector of the second transistor Q2 and the regulated voltage supply Vreg, causes a voltage drop thereat.

The third transistor Q3, an emitter thereof connected to the base of the first transistor Q1, provides a driving current of the first transistor Q1 designated by $I_{E3}$ in FIG. 1. A collector of the third transistor Q3 is connected to the DC source voltage supply Vcc.

The fourth transistor Q4, a collector thereof connected to a base of the third transistor Q3 and an end of the first bias resistor R1, draws a bypass current $I_{C4}$ from the base of the third transistor Q3. By this, the fourth transistor Q4, together with the first bias resistor R1, adjusts the quiescent current $I_{CQ1}$. The other end of the first bias resistor R1 is connected to the regulated voltage supply Vreg. The base of the fourth transistor Q4 is connected to the collector of the second transistor Q2 and the bypass capacitor Cb and an emitter of the fourth transistor Q4 is connected to the ground via the emitter resistor R3.

Base voltages of the third transistor Q3 and the fourth transistor Q4, designated by $V_1$ and $V_2$ in FIG. 1 respectively, can be obtained by the following equations.

$$V_1 = Vreg - (I_{C4} + I_{B3})R1 \quad \text{Eq. (1)}$$

$$V_2 = Vreg - (I_{C2} + I_{B4})R2 \quad \text{Eq. (2)}$$

Referring to Eqs. (1) and (2), an operation of the adaptive bias circuit 20 in accordance with a preferred embodiment of the present invention can be described as follows. When an input power of Q1 rises, the input power of Q2 also rises to increase $I_{C2}$, i.e., a collector current of Q2. Accordingly, $V_2$ falls to reduce the bypass current $I_{C4}$. If $V_2$ falls so greatly as to turn Q4 off, $I_{C4}$ becomes substantially zero. As the bypass current $I_{C4}$ reduces, a voltage drop at the first bias resistor R1 decreases to raise V1. This makes the driving current $I_{E3}$ increase, thereby resulting in an increase of the quiescent current $I_{CQ1}$. On the other hand, in case the input power of Q1 reduces, the input power of Q2 also reduces to decrease $I_{C2}$. Thereafter, a rise of $V_2$, an increase of $I_{C4}$, a reduction of $V_1$ and a decrease of $I_{E3}$ follow in this sequence. Resultantly, the quiescent current $I_{CQ1}$, reduces. As described above, by using the adaptive bias circuit 20, the quiescent current $I_{CQ1}$, increases within a certain range as the input power of Q1 increases and decreases within a certain range as the input power of Q1 decreases.

Figure 2:
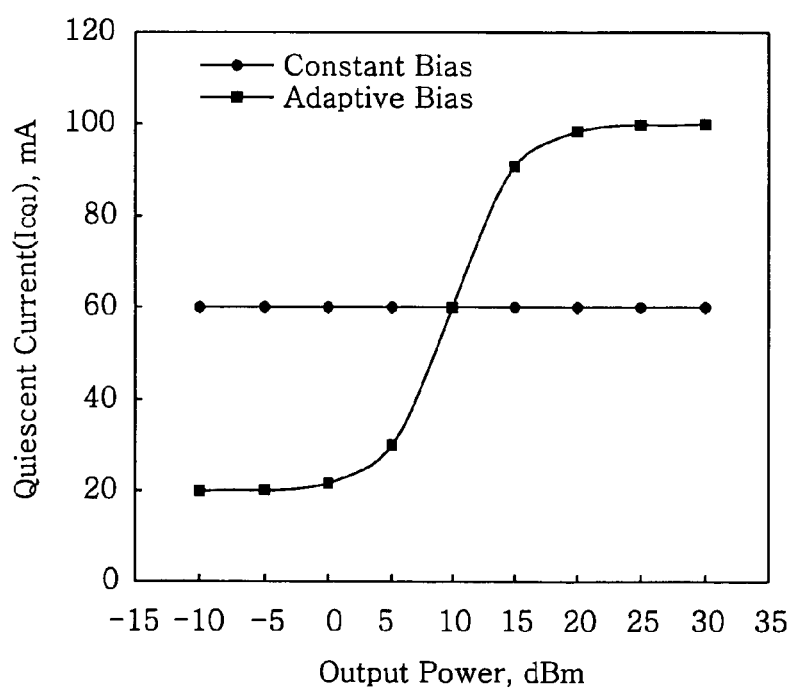
FIG. 2 provides a graph representing a quiescent current versus an output power.

Referring to FIG. 2, there is provided a graph representing the quiescent current $I_{CQ1}$ versus an output power of the power amplifier module, which is equivalent to an output power of Q1. The output power of the power amplifier module depends on an input power of the power amplifier module, which is proportional to the input power of Q1. That is, the output power of the power amplifier module increases as the input power of Q1 rises. Moreover, provided with the adaptive bias circuit 20, the quiescent current $I_{CQ1}$ increases within a certain range as the input power of Q1 rises. Therefore, as shown in FIG. 2, the quiescent current $I_{CQ1}$ increases within a certain range as the output power of the power amplifier module rises due to an operation of the adaptive bias circuit 20. When the output power of the power amplifier module is greater than a threshold value, e.g., about 20 dBm, Q4 is off and $I_{CQ1}$ maintains at a predetermined value, e.g., about 100 mA. Thus, the adaptive bias circuit in accordance with the preferred embodiment of the present invention can adjust the quiescent current of the RF power amplifier so that the quiescent current becomes low when the output power becomes low and becomes high when the output power becomes high, thereby improving a power added efficiency when the output power is low as well as maintaining a high linearity of the power amplifier when the output power is high.

As described above, the present invention provides a cost-effective and miniaturized adaptive bias circuit capable of effectively controlling DC power consumption as the output power varies to thereby greatly improve a power added efficiency when the output power is low as well as maintaining a high linearity of the power amplifier when the output power is high. Although the above-described preferred embodiment of the present invention is used for a power amplifier operating within a RF range, the present invention can also be used for other kind of amplifier or a power amplifier operating within other frequency range.

While the invention has been shown and described with respect to the preferred embodiment, it will be understood by those skilled in the art that various modifications may be made without departing from the sprit and scope of the invention as defined in the following claims.

What is claimed is:

1. An amplifier module comprising:
   an amplifier circuit for amplifying an input signal to generate an output signal; and
   an adaptive bias circuit for receiving the input signal to provide a driving current to the amplifier circuit for controlling a quiescent current of the amplifier circuit,
   wherein the adaptive bias circuit includes:
   a driving transistor for receiving a driving transistor input current to provide the driving current to the amplifier circuit;
   a drawing transistor for drawing a bypass current from the driving transistor input current to reduce the driving current in response to the input signal; and
   an adjusting transistor for receiving the input signal to adjust a control voltage in response to the input signal,
   wherein the drawing transistor is connected to the base of the driving transistor, and the bypass current increases when the control voltage increases.

2. The amplifier module of claim 1, wherein the quiescent current is reduced when the driving current is reduced and the bypass current increases when the input signal is reduced.

3. The amplifier module of claim 1, wherein the amplifier circuit includes a first transistor and a choke inductor.

4. The amplifier module of claim 3, wherein the first transistor is of a multi-cell structure.

5. The amplifier module of claim 3, wherein the choke inductor is an RF choke inductor.

* * * * *